United States Patent [19]
Fujii et al.

[11] Patent Number: 5,917,186
[45] Date of Patent: Jun. 29, 1999

[54] FOCUSED ION BEAM OPTICAL AXIS ADJUSTMENT METHOD AND FOCUSED ION BEAM APPARATUS

[75] Inventors: Toshiaki Fujii; Yasuhiko Sugiyama, both of Chiba, Japan

[73] Assignee: Seiko Instruments Inc., Chiba, Japan

[21] Appl. No.: 08/925,976

[22] Filed: Sep. 9, 1997

[51] Int. Cl.$^6$ .......................... H01J 37/15; H01J 37/256; H01J 37/304

[52] U.S. Cl. ................. 250/309; 250/492.21; 250/491.1; 250/423 R

[58] Field of Search .............................. 250/309, 491.1, 250/492.21, 423 R

[56] References Cited

U.S. PATENT DOCUMENTS

| | | | |
|---|---|---|---|
| 4,524,277 | 6/1985 | Shimura et al. ...................... | 250/491.1 |
| 5,420,415 | 5/1995 | Trueira ................................. | 250/492.21 |

*Primary Examiner*—Jack I. Berman
*Attorney, Agent, or Firm*—Loeb & Loeb LLP

[57] ABSTRACT

To provide a focused ion beam optical axis alignment method and a focused ion beam apparatus which make axis alignment work of for example when replacing an ion source of a focused ion beam apparatus easy. A method for adjusting the optical axis of a focused ion beam apparatus having an ion source part 3 made up of an ion source 1 for producing an ion beam and a pullout electrode 2, a first aperture 5 which passes a central part having a high energy density of the ion beam and measures the electric current thereof, a charged particle optical system 9 including a condenser lens 6, a second aperture 7 and an objective lens 8, a deflecting electrode 16 which scans the focused ion beam, and a secondary charged particle detector for detecting secondary charged particles arising as a result the focused ion beam being radiated onto a sample, wherein while moving the ion source 1 in a direction intersecting orthogonally with the optical axis of the ion beam the amount of secondary charged particles detected by the secondary charged particle detector is monitored and the position of the ion source 1 is adjusted so this amount of secondary charged particles becomes a maximum.

14 Claims, 2 Drawing Sheets

FOCUSED ION BEAM OPTICAL AXIS ADJUSTMENT METHOD AND FOCUSED ION BEAM APPARATUS

BACKGROUND OF THE INVENTION

This invention relates to an ion beam optical axis adjustment method in a focused ion beam apparatus and to a focused ion beam apparatus.

Conventionally, for example like the apparatus introduced in the literature Submicron Working Using Focused Ion Beam (SSD 81–76)'(Electronic Communications Society Research Group, Dec. 21, 1981), focused ion beam apparatuses have been known which, after constricting an ion beam produced from a liquid metal ion source such as Gallium with a fixed stop, to obtain beam current and diameter over a wide range, constrict the ion beam further by means of an aperture having a plurality of different openings and made so that it is possible to select these arbitrarily, focus it into a spot shape with an objective lens, raster scan radiate it using a deflecting electrode and carry out working of a sample surface. Also, they are provided with an image display device for displaying a pattern of the sample surface on the basis of the plane strength distribution of secondary charged particles emitted from the sample surface onto which the ion beam was radiated.

In this kind of focused ion beam apparatus, to make it fully exhibit its performance, it is considered necessary to make it so that the ion beam passes through the centers of ion optical system parts such as a stop, a lens and a deflecting electrode. To achieve this, the performance as an apparatus has been realized by performing highly accurate machining in making the parts and securing assembly accuracy of the order of microns in assembly.

However, because the ion source is consumed with use of the focused ion beam apparatus, it is necessary to replace it when required, but at the time of replacement the ion beam produced from the new ion source does not always pass through the centers of the ion optical system parts. Because of this, it is necessary to adjust the position of the ion beam so that it passes through the centers of the ion optical system parts.

Also, because a stop having a plurality of different openings and made so that these can be selected arbitrarily wears and stains with use of the focused ion beam apparatus, it also must be replaced periodically. At the time of this replacement, because a position misalignment between the center of the new stop and the ion beam arises, it is necessary to carry out that adjustment.

That is, conventionally, when the ion source has been replaced, for example as shown in the apparatus described in Japanese Unexamined Patent Publication No. H.3-29249, the ion source is mounted on an X–Y stage and the position of the ion source is adjusted by driving this X–Y stage. However, in this case, the position misalignment is adjusted with the ion source attachment position being checked visually with a CRT monitor, and there is no mention of a method with which it is possible to determine that the ion beam produced from the ion source is passing through the centers of the ion source optical system parts. Also, as another example, as described in Japanese Unexamined Utility Model Publication No. S.59-47960, there is an apparatus wherein a second anode part is provided movably in a horizontal direction and a driving mechanism for driving this second anode part in the horizontal direction is provided. This is an apparatus relating to an electron gun, but it can also be utilized in relation to an ion source. However, in this example also, there is no mention relating to how it is possible to determine that the beam is passing through the centers of the optical system parts.

Consequently, conventionally, it has been realized by making it converge on the target position by carrying out the operation for positional adjustment of the ion source repeatedly, and the degree of achievement of that adjustment and the time required for the operation depend on the skill of the worker. Also, because the parameters relating to the adjustment have not been quantified, it cannot be carried out automated with a computer.

As one solution method for this kind of position adjustment, there is the method described in Japanese Unexamined Patent Publication No. S.61-88437. This method is one wherein a substance to be ionized stored in a storage part is gradually supplied to a reservoir which holds it in a molten state and can be used for a long period without the position of the ion source being changed. In other words, it is a method which makes position adjustment of the ion source unnecessary. However, because due to the fact that the structure thereof is complex and that there are multiple transmission holes the ion beam and secondarily produced particles pass through these multiple transmission holes and become noise components, it becomes difficult to realize the performance of image quality and resolving power and the like sought in a focused ion beam apparatus.

On the other hand, the effect of using a stop having a plurality of different opening diameters is shown in the above-mentioned literature Submicron Working Using Focused Ion Beam', and also, in connection with a method of selecting an optimum opening from the different openings, one is described in Japanese Unexamined Patent Publication No. H.3-163741, but in neither is the center of the opening correctly aligned with respect to the ion beam. Therefore, like the position adjustment of the ion source, because the position adjustment is realized by making it converge on the target position by carrying out the operation repeatedly, the degree of achievement of that adjustment and the time required for the operation depend on the skill of the worker. Also, because the parameters relating to the adjustment have not been quantified, it cannot be carried out automated with a computer.

This invention, in view of this kind of situation, makes its problem providing a focused ion beam optical axis alignment method and a focused ion beam apparatus which make easy the axis alignment work of times such as when replacing an ion source or a stop of a focused ion beam apparatus.

SUMMARY OF THE INVENTION

The present invention, which solves the above-mentioned problem, is in a method of adjusting the optical axis of a focused ion beam apparatus having an ion source part made up of an ion source for producing an ion beam and a pullout electrode, a first aperture which passes a central part having a high current density of the ion beam, a charged particle optical system which includes a condenser lens, a second aperture and an objective lens and makes the ion beam having passed through the first aperture a focused ion beam, a deflecting electrode for scanning the focused ion beam, and a secondary charged particle detector for detecting secondary charged particles arising as a result of radiating the focused ion beam onto a sample, characterized in that while the ion source and/or the second aperture is moved in a direction intersecting orthogonally with the optical axis of the ion beam the amount of secondary charged particles detected by the secondary charged particle detector is monitored and the position of the ion source and/or the second aperture is set so that this amount of secondary charged particles or the ion current irradiating the sample surface becomes a maximum.

Also, it is in a focused ion beam apparatus characterized in that it comprises an ion source part having an ion source for producing an ion beam and a pullout electrode, a first aperture which passes a central part having a high current density of the ion beam, a charged particle optical system which includes a condenser lens, a second aperture and an objective lens and makes the ion beam having passed through the first aperture a focused ion beam, a deflecting electrode for scanning the focused ion beam, a secondary charged particle detector for detecting secondary charged particles arising as a result of radiating the focused ion beam onto a sample, a first XY direction moving device for moving the ion source in a direction intersecting orthogonally with the optical axis of the ion beam, first XY direction movement controlling means for controlling the first XY direction moving device with the amount of secondary charged particles detected by the secondary charged particle detector as an index, a second XY direction moving device for moving the second aperture in a direction intersecting orthogonally with the optical axis of the ion beam, and second XY direction movement controlling means for controlling the second XY direction moving device with the amount of secondary charged particles detected by the secondary charged particle detector as an index.

By means of the construction described above, while the ion source and/or the second aperture is moved, the movement of the ion source and/or the second aperture is controlled so that the amount of secondary charged particles detected by the secondary charged particle detector or the irradiating ion beam current becomes a maximum. When this kind of control is carried out, the center, where the beam current density is high, of the ion beam produced from the ion source and the center of the transmitting hole of the first aperture and the center of the transmitting hole of the second aperture coincide.

DETAILED DESCRIPTION

The invention will now be described on the basis of an embodiment.

Figure 1:
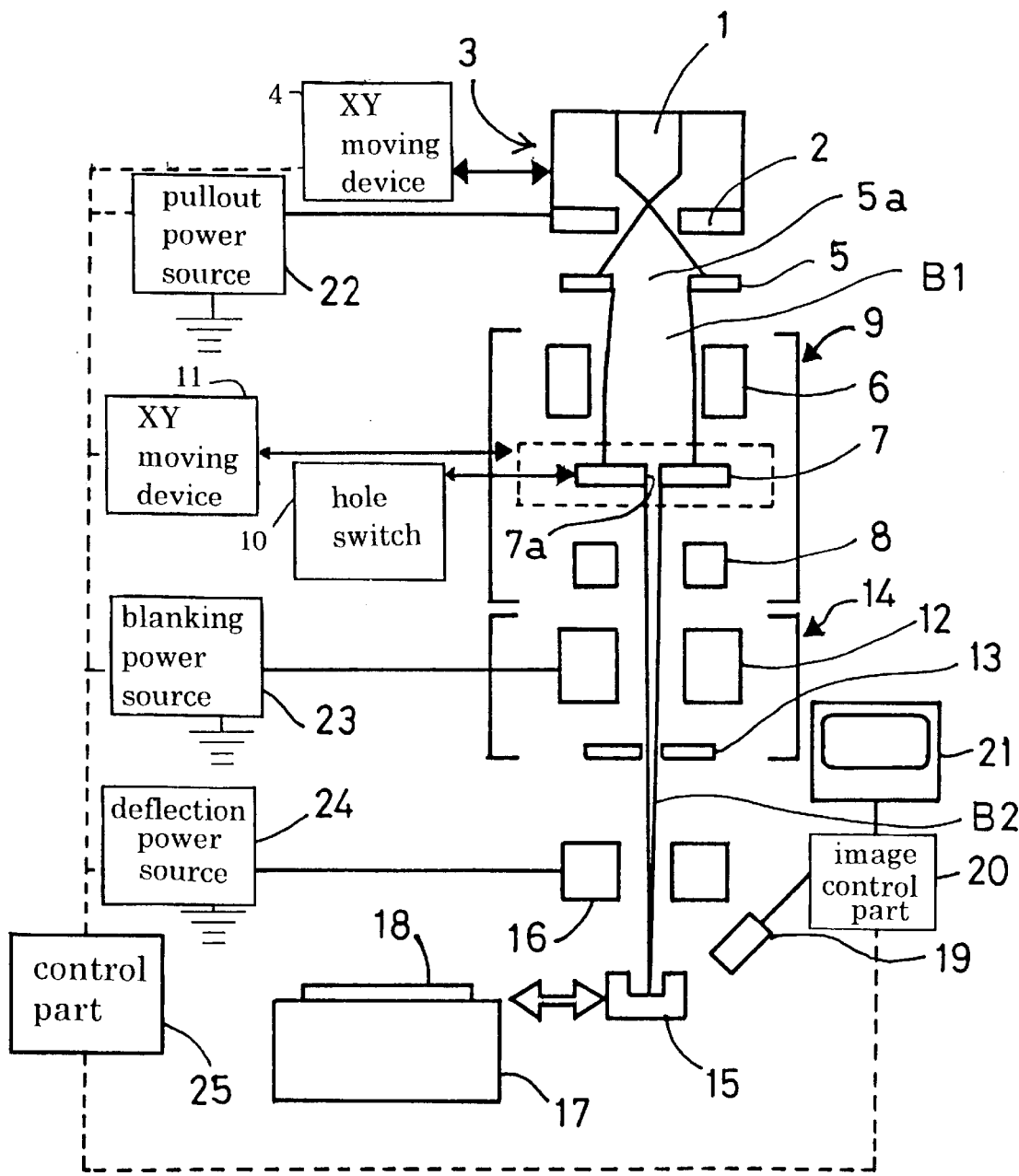
FIG. 1 is a construction view showing the outline construction of a focused ion beam apparatus pertaining to a practicing mode of the invention.

FIG. 1 is a view showing the outline construction of a focused ion beam apparatus pertaining to a first practicing mode. As shown in FIG. 1, for example, an ion source part 3 having a liquid metal ion source 1 made of Ga or the like and a pullout electrode 2 is mounted on an XY direction moving device 4, and the first XY direction moving device 4 is disposed movably in XY directions that are two directions intersecting orthogonally with the axis of a beam produced from the ion source part 3. A first aperture 5 having a first transmitting hole 5a for passing only a central part, having a high current density, of a high-intensity ion beam B1 produced from the ion source part 3 is disposed on the beam radiation side of the ion source part 3. Also, a charged particle optical system 9 made up of a condenser lens 6, a second aperture 7 and an objective lens 8 is disposed along the beam axis on the beam emission side of the first aperture 5. The high-intensity ion beam B1 produced from the ion source 1 is focused by the charged particle optical system 9 and becomes a focused ion beam B2.

Here, the second aperture 7 has a plurality of second transmitting holes 7a whose diameter dimensions differ (although the other transmitting holes are not shown), and can be switched by a transmitting hole switching device 10. That is, in the second aperture 7 a plurality of transmitting holes 7a whose dimensions differ the hole diameter disposed on the beam axis can be changed by the transmitting hole switching device 10. In this example, by a member having a plurality of second transmitting holes 7a whose diameter dimensions differ being made to slide the diameter dimensions of the second transmitting holes 7a are made changeable. However, alternatively the diameter dimension of a single second transmitting hole 7a may be made changeable continuously or stepwise like a pupil or a diaphragm of a camera. Thus the construction of this transmitting hole switching device 10 is not particularly limited.

Also, the second aperture 7 has the radial direction position of each second transmitting hole 7a movable in XY directions by a second XY direction moving device 11.

On the beam emission side of the charged particle optical system 9, blanking means 14 made up of a blanking electrode 12 and a blanking aperture 13 is provided, and performs turning ON/OFF of the focused ion beam. That is, when turning the focused ion beam B2 OFF, it impresses a voltage on the blanking electrode 12 and causes it to deflect the focused ion beam B2 greatly and thereby blocks it with the blanking aperture 13. The disposition of the blanking electrode 12 and the blanking aperture 13 is not limited to this, and for example they may alternatively be disposed above or in the middle of the charged particle optical system 9.

Also, a deflecting electrode 16 for scanning the focused ion beam B2 having passed through the blanking aperture 13 to a desired position is disposed on the beam emission side of the blanking aperture 13, and the focused ion beam B2 scanned by the deflecting electrode 16 is scanned/radiated in a desired position/area on a sample 18 on a sample stage 17.

A detector 19 for detecting secondary charged particles emitted from the surface of the sample 18 onto which the focused ion beam B2 has been radiated is disposed above the sample stage 17, and an image control part 20 which amplifies the detection signal and finds the plane strength distribution of the secondary charged particles and an image display device 21 which displays a pattern formed on the sample surface on the basis of a plane strength distribution signal from this image control part 20 are connected to this detector 19.

Also, a Faraday cup 15 positionally interchangeable with the sample stage 17 is disposed at the side of the sample stage 17. The Faraday cup 15 receives the focused ion beam B2 irradiation in place of the sample 18 and measures the beam current thereof. The Faraday cup 15 may alternatively be disposed above the sample stage 17 and in a position not overlapping with the sample 18.

To the above-mentioned pullout electrode 2, blanking electrode 12 and deflecting electrode 16 are respectively connected a pullout power source 22, a blanking power source 23 and a deflecting power source 24 for impressing desired voltages on each, and a control part 25 consisting of a computer system which performs overall control of the whole of this focused ion beam apparatus and can individually control the first XY direction moving device 4, the transmitting hole switching device 10, the second XY direction moving device 11 and the above-mentioned electrodes 22 through 24 and so on is also provided. In other words, the control part 25 includes first XY direction movement controlling means which controls the movement and position of the first XY direction moving device 4 which planarly moves the ion source part 3. Also, the control part 25 includes second XY direction movement controlling means which controls the movement and position of the second XY direction moving device 4 which planarly moves the second aperture 7.

With this kind of focused ion beam apparatus, by the ion beam B1 pulled out from the ion source part 3 being focused by means of the charged particle optical system 9 and scanned by means of the deflecting electrode 16 and radiated onto the sample 18, it is possible to carry out working of the sample 18. Also, although it is not shown in this example, by providing a gas radiation nozzle in the vicinity of the sample 18 and supplying gas through the gas radiation nozzle simultaneously with radiating of the focused ion beam B2, it is possible to carry out ion beam assisted CVD film formation locally.

Also, when carrying out this kind of working, the working position/area settings and the working state are carried out using image observation of the image display device 21. Although it is not shown in this example, the surface of the sample 18 may be irradiated using for example ordinary illumination so that it is possible to observe the sample surface with an optical microscope at the same time.

An optical axis adjustment method of this kind of focused ion beam apparatus will now be described. At this time, as the sample 18, by using one which is a uniform plane with no irregularities and a high secondary particle yield, it is possible to raise work facility.

First, optical axis adjustment of the ion source part 3 will be described. While the ion source part 3 is respectively moved in the X direction and the Y direction by the first XY direction moving device 4, the amount of secondary charged particles detected by the secondary charged particle detector is monitored and the ion source part 3 is fixed at the point at which this amount of secondary charged particles becomes a maximum.

Here, the first XY direction moving device 4 is not particularly limited as long as it is one with which it is possible to move the ion source part 3 finely in at least two directions, and for example the X direction movement and the Y direction movement may alternatively be respectively carried out by independent linear actuators. Also, although the XY direction moving device 4 may be one automatically movable by control of the control part 25 including the first XY direction movement controlling means, it may also be one finely movable by hand. For example, as a specific example, the device mentioned in Japanese Unexamined Patent Publication No. H.3-29249 may be given.

Also, in this practicing mode, the ion source part 3 was moved, but of course it is clear that the same effects can also be provided by moving just the ion source 1. The construction of the ion source part 3 also is not limited to one consisting of an ion source and a pullout electrode only and for example may have a control electrode for controlling the production of the ion beam besides the pullout electrode. In this case also, the whole ion source part may be moved or just the ion source 1, or just the ion source 1 and the control electrode may be moved. In the practicing mode in the following also, although it is described with the ion source part 3 being one which moves, it is the same in the following.

Next, optical axis alignment of the charged particle optical system 9 and particularly of the second aperture 7 will be described. In this case, while the aperture 7 is moved in the X direction and the Y direction respectively by means of the XY direction moving device 10 the amount of secondary charged particles detected by the secondary charged particle detector 19 is measured and the second aperture 7 is fixed at the point at which this amount of secondary charged particles becomes a maximum. The second XY direction moving device 4 can be moved automatically by control of the control part 25 including the second XY direction movement controlling means.

In all the optical axis adjustments described above, adjustment is made possible with the amount of secondary charged particles detected by a secondary charged particle detector as the determination material, and because the amount of secondary charged particles is converted into an electrical signal such as a current value or a voltage value, automatic adjustment is possible by computer control, and there is the merit that compared to methods which rely on the experience and skill of a worker it is possible to carry out the best axis alignment rapidly and objectively at all times. Also, because it is possible to carry out optical axis alignment using objective measured values as indices, there is also the merit that computer-based automation becomes possible.

Figure 2:
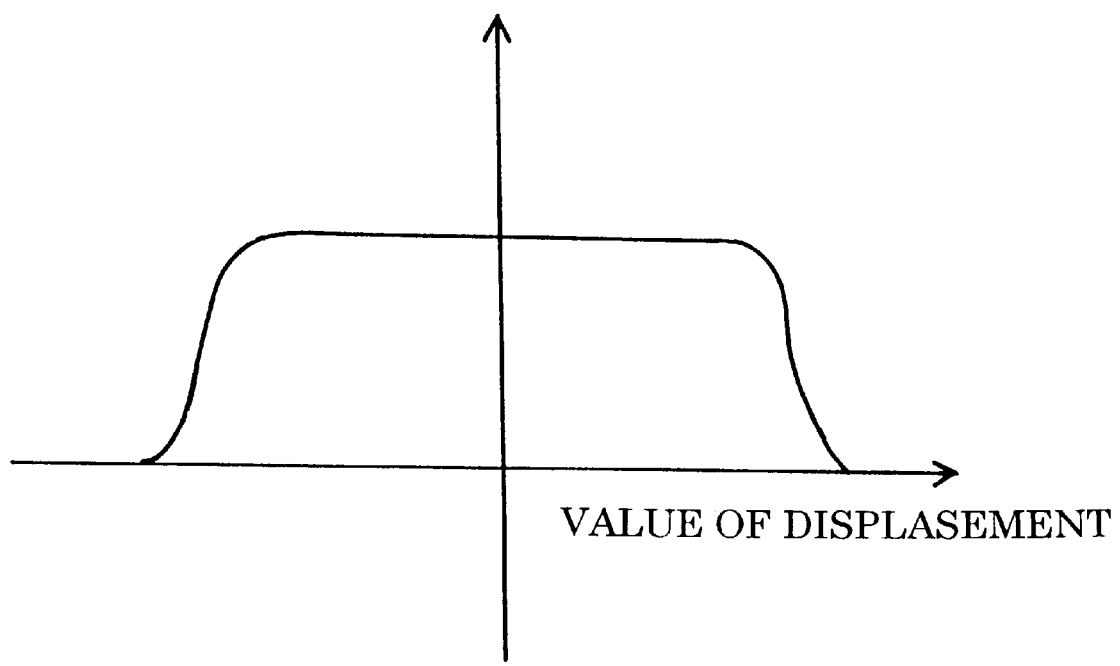
FIG. 2 is a view showing test results of the invention.

In FIG. 2, results obtained when change of the amount of secondary charged particles detected by the secondary charged particle detector 19 of when in the focused ion beam apparatus described above the ion source part 3 is moved in the X-axis direction (a) and in the Y-axis direction (b) was measured are shown.

When the kind of measured values of FIG. 2 are obtained, although the method for carrying out optical axis alignment automatically by means of computer processing is not particularly limited, for example by the method of performing position alignment with the midway point between the spots at −10% from the maximum value of the amount of detected secondary charged particles determined to be the center it is possible to carry out automation very easily. With this method it is possible to run in to the order of a few tens of microns.

The optical axis adjustment method described above was described with an example wherein it is applied to the focused ion beam apparatus shown in FIG. 1, but needless to say it can be applied to focused ion beam apparatuses of various constructions. To carry out the optical axis adjustment described above in a case wherein essentially a first aperture 5 does not exist at the ion beam exit of the ion source part, it is necessary to provide a fixed aperture anywhere between the charged particle optical system 9 and the deflecting electrode 16. This fixed aperture is one having a transmitting hole substantially the same as the diameter of the focused ion beam or of a smaller diameter than that, and it is necessary for the center of this transmitting hole to be disposed so that it coincides with the optical axis of the charged particle optical system 9.

In the above, the positions of the ion source part 3 and the second aperture 7 are set on the basis of a detected amount of secondary charged particles arising from the sample 18 as a result of the focused ion beam irradiation. Besides this, it is possible to set the positions of the ion source part 3 and the second aperture 7 on the basis of the ion beam current detected by means of the Faraday cup 15. That is, it is because the amount of secondary charged particles becomes greater the higher the irradiating ion beam current is.

As described above, with this invention, because it is possible to realize optical axis alignment rapidly and objectively with an amount of secondary charged particles as an index, the axis alignment work of for example when replacing an ion source of a focused ion beam apparatus can be made easy, and also, because optical axis alignment can be carried out with an objective measured values as an index, there is the effect that it is possible to carry out computer-based automation easily.

What is claimed is:

1. A method of adjusting the optical axis of a focused ion beam apparatus having an ion source part made up of an ion source for producing an ion beam and a pullout electrode, a first aperture which passes a central part having a high current density of the ion beam, a charged particle optical system made up of a condenser lens for constricting the ion beam, a second aperture for regulating the beam shape of the ion beam and an objective lens for further constricting the ion beam and making it a focused ion beam, a deflecting electrode for scanning the focused ion beam, and a secondary charged particle detector for detecting secondary charged particles arising as a result of radiating the focused ion beam onto a sample, characterized in that while the ion source is moved in a direction intersecting orthogonally with the optical axis of the ion beam the focused ion beam is radiated onto the sample surface and the amount of secondary charged particles arising as a result of this irradiation is measured with the secondary charged particle detector and the position of the ion source is set so that this amount of secondary charged particles becomes a maximum.

2. A method of adjusting the optical axis of a focused ion beam apparatus having an ion source part having an ion source for producing an ion beam and a pullout electrode, a first aperture which passes a central part having a high current density of the ion beam, a charged particle optical system made up of a condenser lens for constricting the ion beam, a second aperture for regulating the beam shape of the ion beam and an objective lens for further constricting the ion beam and making it a focused ion beam, a deflecting electrode for scanning the focused ion beam, and a secondary charged particle detector for detecting secondary charged particles arising as a result of radiating it onto a sample, characterized in that while the second aperture is moved in a direction intersecting orthogonally with the optical axis of the ion beam the focused ion beam is radiated onto the sample surface and the amount of secondary charged particles arising as a result of this irradiation is measured with the secondary charged particle detector and the position of the ion source is set so that this amount of secondary charged particles becomes a maximum.

3. A focused ion beam optical axis adjustment method according to claim 2, characterized in that the dimension of a transmitting hole of the second aperture for passing the ion beam can be changed and positional adjustment of the second aperture is carried out for a transmitting hole of each dimension.

4. A method of adjusting the optical axis of a focused ion beam apparatus having an ion source part made up of an ion source for producing an ion beam and a pullout electrode, a first aperture which passes a central part having a high current density of the ion beam, a charged particle optical system made up of a condenser lens for constricting the ion beam, a second aperture for regulating the beam shape of the ion beam and an objective lens for further constricting the ion beam and making it a focused ion beam, a deflecting electrode for scanning the focused ion beam, and a secondary charged particle detector for detecting secondary charged particles arising as a result of radiating the focused ion beam onto a sample, characterized in that it comprises a step of while moving the ion source in a direction intersecting orthogonally with the optical axis of the ion beam radiating the focused ion beam onto the sample surface and measuring the amount of secondary charged particles arising as a result of this irradiation with the secondary charged particle detector and setting the position of the ion source so that this amount of secondary charged particles becomes a maximum and a step of while moving the second aperture in a direction intersecting orthogonally with the optical axis of the ion beam radiating the focused ion beam onto the sample surface and measuring the amount of secondary charged particles arising as a result of this irradiation with the secondary charged particle detector and setting the position of the ion source so that this amount of secondary charged particles becomes a maximum.

5. A focused ion beam optical axis adjustment method according to claim 4, characterized in that the dimension of a transmitting hole of the second aperture for passing the ion beam can be changed and positional adjustment of the second aperture is carried out for a transmitting hole of each dimension.

6. A focused ion beam apparatus characterized in that it has an ion source part having an ion source for producing an ion beam and a pullout electrode, a first aperture which passes a central part having a high current density of the ion beam, a charged particle optical system made up of a condenser lens for constricting the ion beam, a second aperture for regulating the beam shape of the ion beam and an objective lens for further constricting the ion beam and making it a focused ion beam, a deflecting electrode for scanning the focused ion beam, a secondary charged particle detector for detecting secondary charged particles arising as a result of radiating the focused ion beam onto a sample, a first XY direction moving device for moving the ion source in a direction intersecting orthogonally with the optical axis of the ion beam and first XY direction movement controlling means for controlling the first XY direction moving device on the basis of the amount of secondary charged particles detected by the secondary charged particle detector.

7. A focused ion beam apparatus according to claim 6, characterized in that during the movement of the ion source the first XY direction movement controlling means controls the first XY direction moving device so that the amount of secondary charged particles detected by the secondary charged particle detector becomes a maximum.

8. A focused ion beam apparatus characterized in that it comprises an ion source part having an ion source for producing an ion beam and a pullout electrode, a first aperture which passes a central part having a high current density of the ion beam, a charged particle optical system made up of a condenser lens for constricting the ion beam, a second aperture for regulating the beam shape of the ion beam and an objective lens for further constricting the ion beam and making it a focused ion beam, a deflecting electrode for scanning the focused ion beam, a secondary charged particle detector for detecting secondary charged particles arising as a result of radiating the focused ion beam onto a sample, a second XY direction moving device for moving the second aperture in a direction intersecting orthogonally with the optical axis of the ion beam and second XY direction movement controlling means for controlling the second XY direction moving device on the basis of the amount of secondary charged particles detected by the secondary charged particle detector.

9. A focused ion beam apparatus according to claim 8, characterized in that during the movement of the second aperture the second XY direction movement controlling means monitors the amount of secondary charged particles detected by the secondary charged particle detector and controls the second XY direction moving device so that this amount of secondary charged particles becomes a maximum.

10. A focused ion beam apparatus characterized in that it comprises an ion source part having an ion source for producing an ion beam and a pullout electrode, a first aperture which passes a central part having a high current density of the ion beam, a charged particle optical system made up of a condenser lens for constricting the ion beam, a second aperture for regulating the beam shape of the ion beam and an objective lens for further constricting the ion beam and making it a focused ion beam, a deflecting electrode for scanning the focused ion beam, a secondary charged particle detector for detecting secondary charged particles arising as a result of radiating the focused ion beam onto a sample, a first XY direction moving device for moving the ion source in a direction intersecting orthogonally with the optical axis of the ion beam, first XY direction movement controlling means for controlling the first XY direction moving device on the basis of the amount of secondary charged particles detected by the secondary charged particle detector, a second XY direction moving device for moving the second aperture in a direction intersecting orthogonally with the optical axis of the ion beam, and second XY direction movement controlling means for controlling the second XY direction moving device on the basis of the amount of secondary charged particles detected by the secondary charged particle detector.

11. A focused ion beam apparatus according to claim 10, characterized in that during the movement of the ion source the first XY direction movement controlling means monitors the amount of secondary charged particles detected by the secondary charged particle detector and controls the first XY direction moving device so that the amount of secondary charged particles detected by the secondary charged particle detector becomes a maximum, and during the movement of the second aperture the second XY direction movement controlling means monitors the amount of secondary charged particles detected by the secondary charged particle detector and controls the second XY direction moving device so that the amount of secondary charged particles detected by the secondary charged particle detector becomes a maximum.

12. A focused ion beam apparatus according to claim 6, further comprising transmitting hole changing means capable of changing the dimension of a transmitting hole of the second aperture for passing the ion beam.

13. A method of adjusting the optical axis of a focused ion beam apparatus having an ion source part made up of an ion source for producing an ion beam and a pullout electrode, a first aperture which passes a central part having a high current density of the ion beam, a charged particle optical system made up of a condenser lens for constricting the ion beam, a second aperture for regulating the beam shape of the ion beam and an objective lens for further constricting the ion beam and making it a focused ion beam, a deflecting electrode for scanning the focused ion beam, and a secondary charged particle detector for detecting secondary charged particles arising as a result of radiating the focused ion beam onto a sample, characterized in that while the ion source is moved in a direction intersecting orthogonally with the optical axis of the ion beam the current of the focused ion beam is measured with a Faraday cup and the position of the ion source is set so that the amount of current of the focused ion beam becomes a maximum.

14. A method of adjusting the optical axis of a focused ion beam apparatus having an ion source part made up of an ion source for producing an ion beam and a pullout electrode, a first aperture which passes a central part having a high current density of the ion beam, a charged particle optical system made up of a condenser lens for constricting the ion beam, a second aperture for regulating the beam shape of the ion beam and an objective lens for further constricting the ion beam and making it a focused ion beam, a deflecting electrode for scanning the focused ion beam, and a secondary charged particle detector for detecting secondary charged particles arising as a result of radiating it onto a sample, characterized in that while the second aperture is moved in a direction intersecting orthogonally with the optical axis of the ion beam the current of the focused ion beam is measured with a Faraday cup and the position of the ion source is set so that the amount of current of the focused ion beam becomes a maximum.

\* \* \* \* \*